US 6,807,054 B1

United States Patent
Waller et al.

(10) Patent No.: US 6,807,054 B1
(45) Date of Patent: Oct. 19, 2004

(54) METHOD AND SYSTEM FOR DEPLOYING A DISPLAY AND KEYBOARD IN A RACK

(75) Inventors: Steven R. Waller, Hiawatha, IA (US); Erin N. Lowe, Cedar Rapids, IA (US); Todd A. Hermanson, Cedar Rapids, IA (US)

(73) Assignee: Crystal Group Inc., Hiawatha, IA (US)

( * ) Notice: Subject to any disclaimer, the term of this patent is extended or adjusted under 35 U.S.C. 154(b) by 35 days.

(21) Appl. No.: 10/249,835

(22) Filed: May 12, 2003

Related U.S. Application Data

(63) Continuation of application No. 09/681,211, filed on Feb. 23, 2001, now Pat. No. 6,563,700.

(51) Int. Cl.$^7$ ................................. H05K 7/18
(52) U.S. Cl. ..................... 361/683; 361/727; 312/223.2
(58) Field of Search ................................ 361/679–687, 361/724–727; 312/223.1, 223.6; 211/26, 151; 206/305, 320; 248/118.1

(56) References Cited

U.S. PATENT DOCUMENTS

| 5,388,032 A | | 2/1995 | Gill et al. |
| 5,835,344 A | * | 11/1998 | Alexander ................... 361/683 |
| 6,142,590 A | | 11/2000 | Harwell |
| 6,175,502 B1 | | 1/2001 | Schaerer et al. |
| 6,185,092 B1 | | 2/2001 | Landrum et al. |
| 6,563,700 B1 | * | 5/2003 | Waller et al. ................ 361/683 |
| 6,611,432 B2 | * | 8/2003 | Blood .......................... 361/724 |
| 2002/0179549 A1 | * | 12/2002 | Felcman et al. ............... 211/26 |

* cited by examiner

*Primary Examiner*—Hung Van Duong
(74) *Attorney, Agent, or Firm*—Simmons, Perrine, Albright & Ellwood, PLLC

(57) ABSTRACT

A system and method for deploying a 1 U-sized display/keyboard unit in a rack of industrial computers which uses a display in a leading position in a linear arrangement with a keyboard, where the display is pivotable with respect to the keyboard and the keyboard is independently retractable with respect to the display.

20 Claims, 2 Drawing Sheets

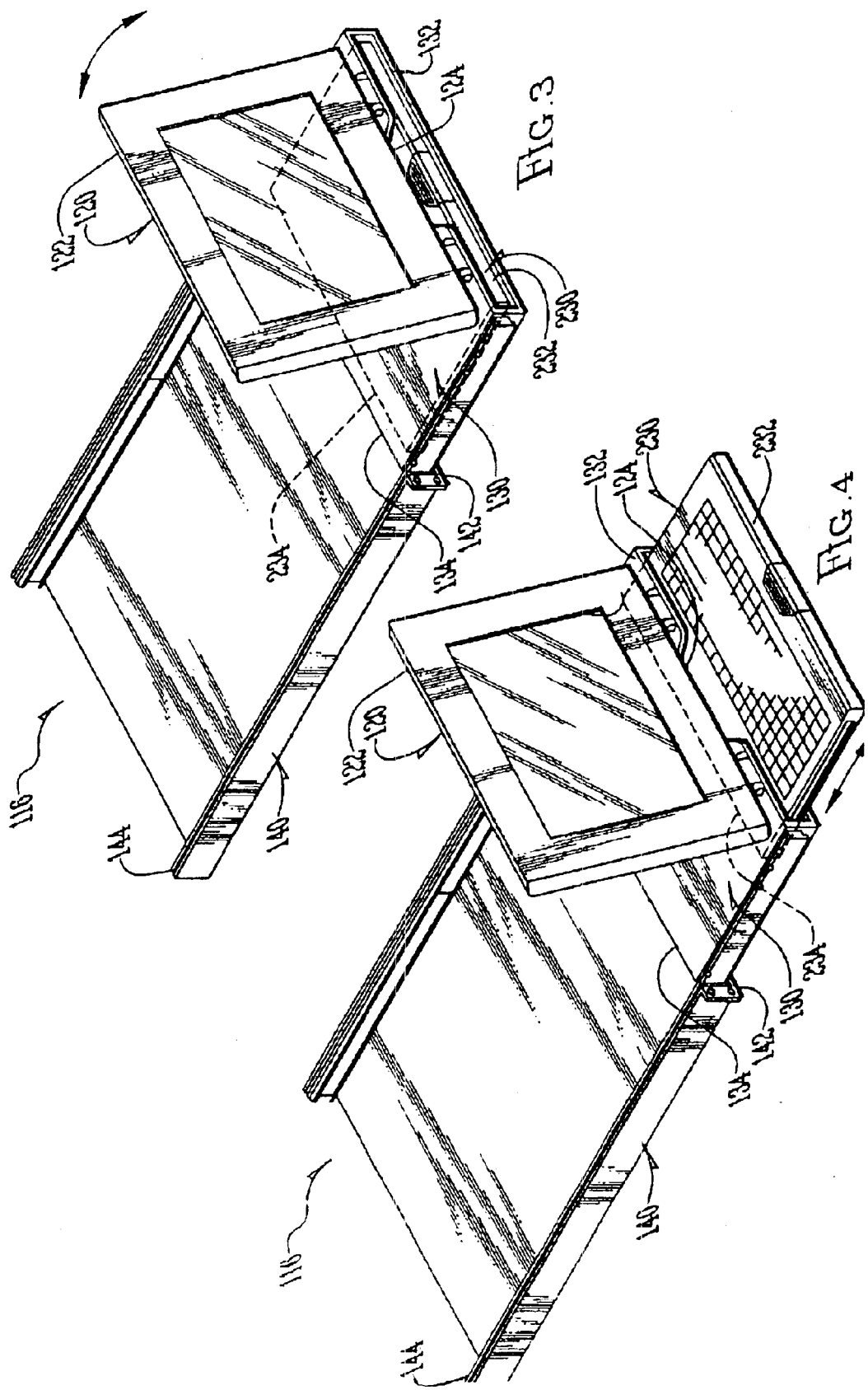

METHOD AND SYSTEM FOR DEPLOYING A DISPLAY AND KEYBOARD IN A RACK

CROSS REFERENCE TO RELATED APPLICATIONS

This application is a continuation application of an application entitled "Method and System for Deploying a Display and Keyboard in a Rack" by Steven R. Waller, Erin N. Lowe and Todd A.

Hermanson, application Ser. No. 09/681,211 and filed on Feb. 23, 2001, which application has been allowed and will issue as U.S. Pat. No. 6,563,700 on May 13, 2003, and which application is incorporated herein in its entirety by this reference.

BACKGROUND OF INVENTION

In recent years, industrial personal computers have become increasingly prevalent in many industries. It is not uncommon today to see rows of industrial PCs arranged in racks. Often these PC have associated with them displays so that a technician can walk among the rows of racks of PCs and can monitor and/or manipulate the status of such PCs. Recently, designers of industrial computers have created very thin computers which fit into a 1 U-sized opening.

In the past, PC engineers have devised computer display and keyboard units which fit into a 1 U slot or bay. Typically, these 1 U display and keyboard units have been designed in either of two ways. The first design is essentially a laptop computer mounted on a rail that slides in and out of a 1 U slot in a rack. The second design is similar, and it may be viewed as a laptop computer with a hinge between the keyboard and the display which permits the display to lie flat on the rail that supports the keyboard, which is the leading edge component when the unit is deployed using the rails.

While these 1 U keyboard and display units have been used extensively in the past, they do have some drawbacks.

First of all, the laptop on a rail or the keyboard and display clam shell model has two significant drawbacks. The display and the keyboard must be designed and manufactured as very thin components, so that when they are folded shut with the display on top of the keyboard, that the closed unit still fits within a 1 U slot in the rack. These design constraints add expense to the finished unit.

Also, this display over keyboard clam shell design requires the keyboard to fully extend into the aisle between the racks even when the technician only wants to monitor the computers using the display and does not wish to use the keyboard.

Secondly, the "fully reclined" display design where the hinge or other connection between the display and the keyboard permits the display to fully recline and to lie flat against the rail suffers from the same aisle encroachment problem as the clam shell approach.

Consequently, there exists a need for improved methods and systems for deploying personal computers or keyboard and display combination units in an efficient manner in a rack of industrial personal computers.

SUMMARY OF INVENTION

It is an object of the present invention to provide a system and method for deploying a display and keyboard combination for a rack-mounted industrial personal computer in an efficient manner.

It is a feature of the present invention to utilize a design having the display component leading during the deployment process.

It is another feature of the present invention to include an independently retractable keyboard.

It is an advantage of the present invention to achieve improved efficiency in stowing and deploying display and keyboard units for rack-mounted 1 U industrial personal computers.

The present invention is an apparatus and method for stowing and deploying 1 U display and keyboard units for rack-mounted industrial personal computers designed to satisfy the aforementioned needs, provide the previously stated objects, include the above-listed features, and achieve the already articulated advantages. The present invention is carried out in a "wasted encroachment-less" manner in a sense that the space consumed by a keyboard during times when it is not in use has been greatly reduced.

Accordingly, the present invention is a system and method including a 1 U sized display and keyboard combination which provides for independent deployment of the keyboard after the display has been deployed.

BRIEF DESCRIPTION OF DRAWINGS

The invention may be more fully understood by reading the following description of the preferred embodiments of the invention, in conjunction with the appended drawings wherein:

FIG. 3 is a perspective view of a partially deployed system of the present invention, where the display is fully deployed and the keyboard remains concealed.

FIG. 4 is a perspective view of a fully deployed system of the present invention.

DETAILED DESCRIPTION

Figure 1:
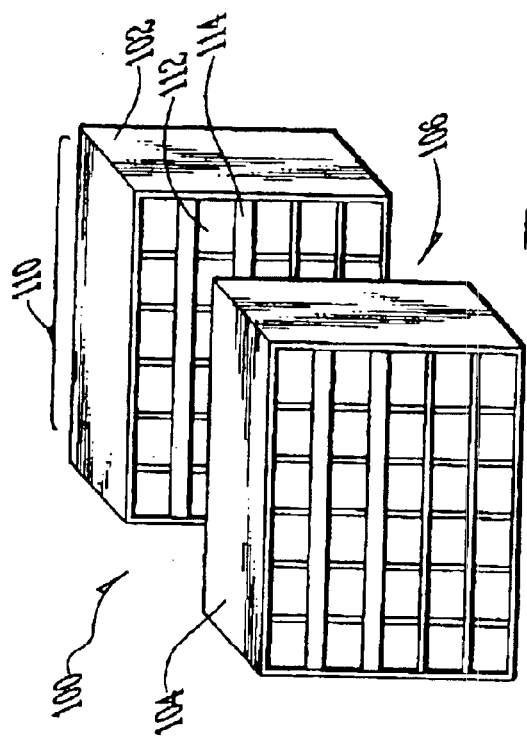
FIG. 1 is a perspective view of a prior art rack-mounted industrial computer system.

Now referring to the drawings wherein like numerals refer to like matter throughout, and more specifically referring to FIG. 1, there is shown a system of the prior art, generally designated 100, including a first rack of industrial personal computers 102 and a second rack of industrial personal computers 104 with an aisle 106 disposed therebetween. First rack of industrial personal computers 102 is representative of second rack of industrial personal computers 104 and is shown in detail to include a plurality of columns of industrial computing components 110. A large industrial computing component 112 is shown disposed in first rack of industrial personal computers 102. A 1 U-sized industrial computing component 114 is shown disposed at an intermediate height of first rack of industrial personal computers 102. A technician may walk in the aisle 106 between first rack of industrial personal computers 102 and second rack of industrial personal computers 104 for various reasons, including installation or repair of components, monitoring or data entry into computers in first rack of industrial personal computers 102, etc.

Figure 2:
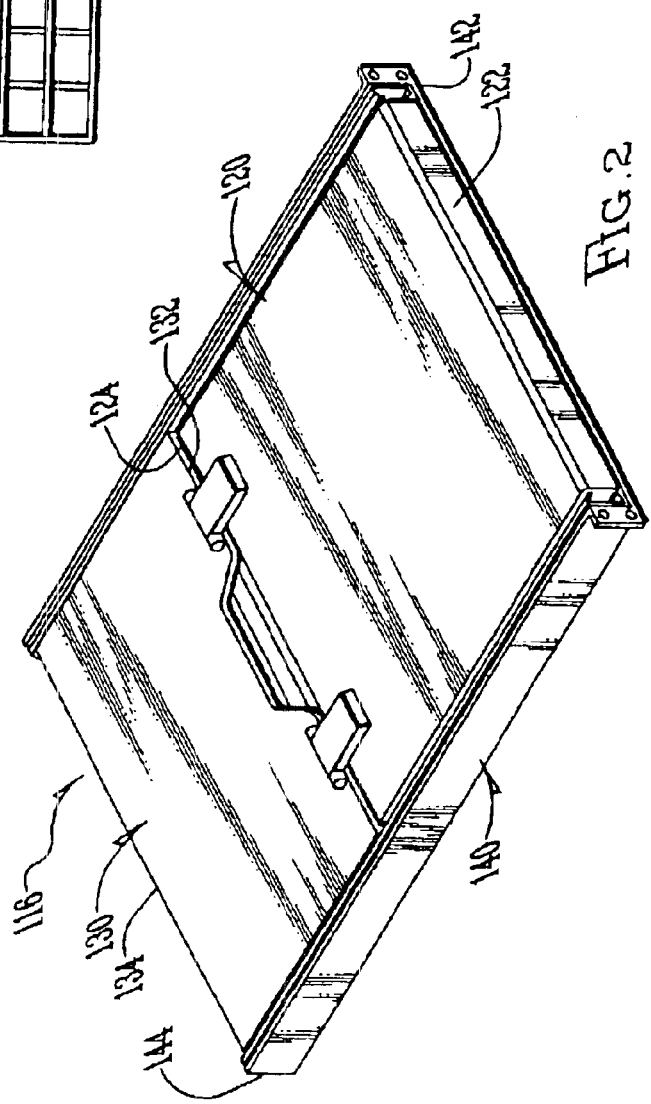
FIG. 2 is a perspective view of a system of the present invention, in which the display/keyboard combination is stowed.

Now referring to FIG. 2, there is shown a 1 U-sized display/keyboard unit 116, of the present invention which may be inserted into a slot or bay in first rack of industrial personal computers 102, which is similar to that holding 1 U-sized industrial computing component 114. 1 U-sized display/keyboard unit 116 is shown having a display 120, with a display leading edge 122 and a display trailing edge 124 disposed in front of a keyboard housing 130 disposed in a display/keyboard rail system 140. 1 U-sized display/keyboard unit 116 is a data I/O unit for both receiving information via the keyboard and for displaying information. Display 120 can be any type of display, such as an LCD or other known flat panel display. Keyboard housing 130 has a keyboard housing leading edge 132 and a keyboard housing trailing edge 134. Display/keyboard rail system 140 has a display/keyboard rail system front end 142 and a display/keyboard rail system rear end 144. Display/keyboard rail system front end 142 could be disposed in first rack of industrial personal computers 102, so that it is exposed to aisle 106. Display/keyboard rail system 140 could use any type of mechanism to permit the display 120 and the keyboard housing 130 to translate in and out of a slot in an industrial PC rack. A simple drawer or slider mechanism or more elaborate systems could be employed depending upon the particular needs for any particular implementation. Keyboard housing 130 is shown as a cover over keyboard 230; however, this is not a necessary feature of keyboard housing 130. Keyboard housing 130 could be a simple drawer or slider mechanism similar to display/keyboard rail system 140 or it could be a shielding dust cover to protect the keyboard 230 from dust and any falling debris. The interface between display trailing edge 124 and keyboard housing leading edge 132 of keyboard housing 130 can be any structure suitable for carrying out variable positioning of display 120. A hinge, such as a piano hinge, side hinges or any type of device to facilitate variable pivoting of display 120 with respect to keyboard housing 130 could be used. Keyboard 230 can be any alphanumeric type of keyboard, numeric keypad or data entry device such as a touch pad, track ball, or other cursor controller.

A more detailed understanding of the present invention can be achieved by now referring to FIG. 3, which shows the 1 U-sized display/keyboard unit 116 of FIG. 2 in a partially deployed arrangement. Display 120 has moved outwardly past display/keyboard rail system front end 142, so that it would extend into aisle 106 if 1 U-sized display/keyboard unit 116 were disposed in first rack of industrial personal computers 102. Display 120 is shown deployed in a position for use. Display 120 has been pivoted from a horizontal position as it is when stowed in FIG. 2, past a vertical position where display leading edge 122 is directly above display trailing edge 124. This tilting of display 120 backwards or upward beyond a vertical arrangement facilitates viewing by a technician whose eyes are above a midpoint between display leading edge 122 and display trailing edge 124 when display 120 is in a vertical arrangement. When the technician's eyes are at the exact same level as such a midpoint, then a vertical arrangement of display 120 may be preferred. When the technician's eyes are below this level, then the display 120 can be pivoted a shorter angular distance so that it is directed downward. When the display 120 is either vertical or directed downward, the display 120 can be retracted back into display/keyboard rail system 140 to limit the amount of encroachment into the aisle 106.

An even more detailed understanding of the present invention may be achieved by now referring to FIG. 4, which shows the 1 U-sized display/keyboard unit 116 of the present invention in a fully deployed arrangement. Keyboard 230 is shown extending outward so that keyboard trailing edge 234 approaches keyboard housing leading edge 132. When keyboard 230 is not needed, it can be stowed by pushing the keyboard leading edge 232 back toward the keyboard housing leading edge 132.

Of course, variations of the pivoting of display 120 could be done as well. For example, display 120 could be made to pivot downward, and the viewing surface of display 120 would be on the opposite side from that shown in FIGS. 3 and 4.

In operation, the apparatus and method of the present invention as described in FIGS. 1–4, could function as follows:

The 1 U-sized display/keyboard unit 116 is disposed in a 1 U sized slot in first rack of industrial personal computers 102 similar to that which houses 1 U-sized industrial computing component 114.

Display/keyboard rail system rear end 144 is disposed internal to first rack of industrial personal computers 102. Display/keyboard rail system front end 142 is adjacent to the aisle 106. When a technician desires to use the display 120, the display 120 can be pulled into the aisle 106. Display 120 can be pivoted about display trailing edge 124, so that display leading edge 122 moves upward. If the technician is viewing from below, the amount of pivoting is limited and the display leading edge 122 never is disposed vertical of display trailing edge 124. If the technician is viewing from above, then display leading edge 122 can be moved past a vertical alignment with display trailing edge 124, so that display 120 is directed upward. In such cases, display 120 will need to be pulled further into the aisle 106 to create space between the backwardly tilted display 120 and the face plates of large industrial computing component 112 or other components disposed above 1 U-sized display/keyboard unit 116. If a keyboard or portions of a keyboard are needed, it can be pulled further into aisle 106.

Throughout this description, reference is made to an industrial PC because it is believed that the beneficial aspects of the present invention would be most readily apparent when used in connection with industrial; however, it should be understood that the present invention is not intended to be limited to industrial PCs and should be hereby construed to include other non-industrial PCs as well.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

What is claimed is:

1. An industrial computer system;
   a 1 U-sized display/keyboard unit including a display for viewing information and a keyboard for data entry; the 1 U-sized display/keyboard unit being disposed in a rack of industrial personal computers;
   said 1 U-sized display/keyboard unit configured so that said display and said keyboard, when stowed, are arranged in a linear fashion with said display being disposed in a front portion of said rack of industrial personal computers and adjacent to an open area and said keyboard being rearward in said first rack of industrial personal computers;
   said display and said keyboard being configured for translational motion in and out of said rack of industrial personal computers;
   said display being configured for motion with respect to said keyboard; and,
   said keyboard being configured for independent motion with respect to said display.

2. A system of claim 1 wherein a first drawer slide mechanism is used to facilitate said independent motion.

3. A system of claim 2 wherein a second drawer slide mechanism is used to facilitate said motion.

4. A system of claim 3 wherein a first hinge is used to facilitate a pivotal motion.

5. A system of claim 4 wherein a second hinge is used to facilitate said pivotal motion.

6. A data I/O unit comprising:

a first slider mechanism for cooperation with a 1 U-sized bay in a first rack of industrial personal computers;

said 1 U-sized bay having a front opening and a rear end, said front opening for accepting therethrough a 1 U-sized component;

a display/keyboard unifying mechanism which is pivotally coupled with a display, via a second slider mechanism, for independent translational motion with a keyboard; and, said display/keyboard unifying mechanism is coupled with said first slider mechanism and is for translational motion of said display and said keyboard in and out of said 1 U-sized bay in said first rack of industrial personal computers.

7. A system of claim 6 where said display is a flat panel display which, when stowed in said 1 U-sized bay, is disposed in front of and closer to said front opening than said keyboard.

8. A system of claim 7 wherein said second slider mechanism and said display/keyboard unifying mechanism are configured so that said keyboard is selectively deployable, via translational motion, from beneath said display after said display has been pivoted upward with respect to said display keyboard unifying mechanism.

9. A system of claim 8 wherein said display/keyboard unifying mechanism is a mounting carriage coupled to both said display and said second slider mechanism.

10. A method of providing input and output of data to an industrial computer disposed in a rack of industrial computers, the method comprising the steps of:

providing a 1 U-sized slot in a rack containing computer equipment; the slot having a front opening and a rear end;

providing, within said slot, a 1 U-sized data I/O device, which includes a display and a data entry device;

said display disposed within said slot in a linear relationship with said data entry device and said display being disposed in a closer proximity to said front opening than said data entry device;

moving said display and said data entry device in a first direction such that said display is projecting beyond said front opening; and pivoting said display upward with resect to said data entry device and around a pivoting axis which is orthogonal with respect to said first direction.

11. A method of claim 10 further comprising the step of:

further pivoting said display to a substantially vertical orientation, and wherein said data entry device is a keyboard.

12. A method of claim 10 wherein said display is directed in a downward direction to a viewer below said slot.

13. A method of claim 11 further comprising the step of:

moving said data entry device in said first direction so that said data entry device extends entirely beyond said front opening.

14. A method of claim 13, further comprising the step of:

further pivoting said display beyond a vertical orientation and directing said display upward to a viewer located above said display.

15. An apparatus comprising:

a display for displaying information to a viewer;

a data entry device for inputting data into an industrial computer;

means for guiding, in a first direction, a combination of said display and said data entry device into and out of a 1 U-sized slot in a rack;

means for pivoting said display; and, means for guiding, said data entry device which is located adjacent said display, after said display has been pivoted from said data entry device.

16. An apparatus of claim 15 wherein said means for guiding, said data entry device is a slider mechanism.

17. An apparatus of claim 15 wherein said data entry device is a keypad.

18. An apparatus of claim 17 wherein said display is an LCD display.

19. An apparatus of claim 18 wherein said means for pivoting comprises a hinge coupled to said display.

20. A system comprising:

a 1 U-sized display/keyboard unit disposed in a 1 U-sized slot in a rack;

said 1 U-sized display/keyboard unit comprising an LCD display for display information and a keyboard for entering data;

said 1 U-sized display/keyboard unit is configured to stow said keyboard in a first portion of said 1 U-sized display/keyboard unit and said display in a second option of said 1 U-sized display/keyboard unit;

said LCD display pivotally coupled so that it can be pivoted above from said keyboard; and, said keyboard coupled so as to permit deployment from said LCD display.

* * * * *

UNITED STATES PATENT AND TRADEMARK OFFICE
CERTIFICATE OF CORRECTION

PATENT NO. : 6,807,054 B1
DATED : October 19, 2004
INVENTOR(S) : Steven R. Waller, Erin N. Lowe and Todd A. Hermanson It is certified that error appears in the above-identified patent and that said Letters Patent is hereby corrected as shown below:

Column 1,
Line 9, please delete the blank line after the initial "A" and move the lines beginning with "Hermanson" into the previous paragraph.
Line 44, please move the paragraph beginning with "Also, this display" into the previous paragraph.

Column 4,
Line 11, the text beginning with the words "Display/keyboard" and ending with the words "can be pulled further into aisle 106" on line 29, should be moved into the previous paragraph.

Column 5,
Line 2, please insert the word -- translational -- after the word "said".

Column 6,
Lines 23 and 27, please delete the comma after the word "guiding".
Line 38, please delete the second occurrence of the word "display" and insert therefor the word -- displaying --.
Line 43, please delete the word "option" and insert therefor -- portion --.
Line 45, please delete the word "above".

Signed and Sealed this

Fifteenth Day of February, 2005

JON W. DUDAS
*Director of the United States Patent and Trademark Office*